(12) United States Patent
Cao et al.

(10) Patent No.: US 6,866,946 B2
(45) Date of Patent: Mar. 15, 2005

(54) HIGH RESISTANCE POLYANILINE USEFUL IN HIGH EFFICIENCY PIXELLATED POLYMER ELECTRONIC DISPLAYS

(75) Inventors: Yong Cao, Goleta, CA (US); Chi Zhang, Goleta, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 242 days.

(21) Appl. No.: 09/725,694

(22) Filed: Nov. 29, 2000

(65) Prior Publication Data

US 2002/0098377 A1 Jul. 25, 2002

Related U.S. Application Data

(63) Continuation-in-part of application No. 09/241,656, filed on Feb. 2, 1999, now Pat. No. 6,441,395.
(60) Provisional application No. 60/168,856, filed on Dec. 2, 1999, and provisional application No. 60/073,411, filed on Feb. 20, 1998.

(51) Int. Cl.$^7$ ............................ H05B 33/00; H01B 1/12
(52) U.S. Cl. .................... 428/690; 428/411.1; 428/917; 313/504; 313/505; 313/506; 257/40; 257/88; 257/103; 427/66; 427/384; 528/422; 525/540; 252/500
(58) Field of Search ........................ 252/500; 525/540; 528/422; 427/66, 384, 385.5, 407.1; 428/411.1, 690, 917; 313/504, 505, 506, 509; 257/40, 88, 103

(56) References Cited

U.S. PATENT DOCUMENTS

| | | | |
|---|---|---|---|
| 5,470,505 A | 11/1995 | Smith et al. | 252/500 |
| 5,489,400 A * | 2/1996 | Liu et al. | 252/500 |
| 5,552,678 A | 9/1996 | Tang et al. | 315/169.3 |
| 5,723,873 A | 3/1998 | Yang | 257/40 |
| 5,798,170 A | 8/1998 | Zhang et al. | 428/212 |
| 6,193,909 B1 * | 2/2001 | Angelopoulos et al. | 252/500 |

FOREIGN PATENT DOCUMENTS

EP 0813212 12/1997
WO WO 99/39394 8/1999

OTHER PUBLICATIONS

Parker, I.D., Carrier tunneling and device characteristics in polymer light–emitting diodes, J. Appl. Phys., Feb. 1, 1994, 1656–1666, 75 (3), American Institute of Physics.

Yang, Y. et al., Polyaniline as a transparent electrode for polymer light–emitting diodes: Lower operating voltage and higher efficiency, Appl. Phys. Lett., Mar. 7, 1994, 1245–1247, 64 (10), American Institute of Physics.

Yang, Y. et al., Enhanced performance of polymer lightemitting diodes using high–surface area polyaniline network electrodes; J. Appl. Phys., Jan. 15, 1995, 694–698, 77 (2), American Institute of Physics.

Gustafsson, G. et al., Flexible light–emitting diodes made from soluble conducting polymers,.Nature, Jun. 11, 1992, 477–479, 357.

Gao, J. et al., Soluble polypyrrole as the transparent anode in polymer light–emitting diodes, Synthetic Metals, 1996, 221–223, 82, Elsevier Science S.A, (no month).

Diaz–Garcia, Maria A. et al., "Plastic" lasers: Comparison of gain narrowing with a soluble semiconducting polymer in waveguides and microcavities. Appl. Phys. Lett., Jun. 16, 1997, 3191–3193, 70 (24), American Institute of Physics.

Armes, Steven P. et al., Novel Colloidal Dispersions of Polyaniline, J. Chem. Soc., Chem. Commun., 1989, 88–89, (no month).

Baldo, M.A. et al., Very high–efficiency green organic light–emitting devices based on electrophosphorescence, Appl. Phys. Lett., Jul. 5, 1999, 4–6, 75 (1), American Institute of Physics.

Cao, Yong et al., Influence of chemical polymerization conditions on the properties of polyaniline, Polymer, Dec. 1989, 2305–2311, 30, Butterworth & Co. (Publishers) Ltd.

* cited by examiner

Primary Examiner—Marie Yamnitzky

(57) ABSTRACT

A film including polyaniline in the emeraldine salt form (PANI) and poly(2-acrylamido-2 methyl-1-propanesulfonic acid) (PAAMPSA) as a counterion and optionally a water-soluble host polymer, the film is useful in an electronic device such as pixellated displays.

16 Claims, 8 Drawing Sheets

HIGH RESISTANCE POLYANILINE USEFUL IN HIGH EFFICIENCY PIXELLATED POLYMER ELECTRONIC DISPLAYS

This application claims the benefit of the filing date of U.S. Provisional Application No. 60/168,856, filed Dec. 2, 1999 and is a continuation-in-part of U.S. patent application Ser. No. 09/241,656, filed Feb. 2, 1999, now U.S. Pat. No. 6,441,395 B1, which claims the benefit of the filing date of U.S. Provisional Application No. 60/073,411, filed Feb. 20, 1998.

FIELD OF INVENTION

This invention relates to a formulation of high resistivity polyaniline in the emeraldine salt form for use in high efficiency pixelated polymer electronic devices, such as emissive displays. The high resistivity layer provides excellent hole injection, prevents electrical shorts, enhances the device lifetime and avoids inter-pixel current leakage.

BACKGROUND OF THE INVENTION

Light emitting diodes (LEDs) fabricated with conjugated organic polymer layers have attracted attention due to their potential for use in display technology.

In the field of organic polymer-based LEDs it has been taught in the art to employ a relatively high work function metal as the anode; said high work function anode serving to inject holes into the otherwise filled $\pi$-band of the semiconducting, luminescent polymer. Relatively low work function metals are preferred as the cathode material; said low work function cathode serving to inject electrons into the otherwise empty $\pi^*$-band of the semiconducting, luminescent polymer. The holes injected at the anode and the electrons injected at the cathode recombine radiatively within the active layer and light is emitted. The criteria for suitable electrodes are described in detail by I. D. Parker, *J. Appl. Phys*, 75, 1656 (1994).

Suitable relatively high work function metals for use as anode materials are transparent conducting thin films of indium/tin-oxide (H. Burroughs, D. D. C. Bradley, A. R. Brown, R. N. Marks, K. Mackay, R. H. Friend, P. L. Burns, and A. B. Holmes, *Nature* 347, 539 (1990); D. Braun and A. J. Heeger, *Appl Phys. Lett.* 58, 1982 (1991)).

Alternatively, thin films of conducting polymers such as polyaniline (see P. Snuth, A. J. Heeger, Y. Cao, J. Chiang and A. Andreatta, U.S. Pat. No. 5,470,505) can be used as demonstrated by G. Gustafsson, Y. Cao, G. M. Treacy, F. Klavetter, N. Colaneri, and A. J. Heeger, *Nature*, 357, 477 (1992), by Y. Yang and A. J. Heeger, *Appl. Phys. Lett* 64, 1245 (1994) and U.S. Pat. No. 5,723,873, by Y. Yang, E. Westerweele, C. Zhang, P. Smith and A J. Heeger, *J. Appl. Phys.* 77, 694 (1995), by J. Gao, A. J. Heeger, J. Y Lee and C. Y Kim, *Synth. Met.*, 82,221 (1996) and by Y. Cao, G. Yu, C. Zhang, R. Menon and A. J. Heeger, *Appl. Phys. Lett.* 70, 3191, (1997). Thin films of indium/tin-oxide and thin films of polyaniline in the emeraldine salt form with certain counterions (PANI(ES)) are preferred because, as transparent electrodes, both enable the emitted light from the LED to radiate from the device in useful levels. Using a layer of PANI(ES), or blends comprising PANI(ES), directly between the ITO and the light-emitting polymer layer, C. Zhang, G. Yu and Y. Cao (U.S. Pat. No. 5,798,170) demonstrated polymer LEDs having bilayer electrodes with long operating lifetimes.

Despite the advantages of using PANI(ES) in a bilayer electrode of polymer LEDs (as described in U.S. Pat. No. 5,798,170), the low electrical resisitivity typical of PANI (ES) inhibits the use of PANI(ES) in pixellated displays. For use in pixellated displays, the PANI(ES) layer should have a high electrical sheet resistance, otherwise lateral conduction causes cross-talk between neighboring pixels. The resulting inter-pixel current leakage significantly reduces the power efficiency and limits both the resolution and the clarity of the display.

Making the PANI sheet resistance higher in a bilayer electrode by reducing the film thickness is not a good option since thinner films give lower manufacturing yield caused by the formation of electrical shorts. This is demonstrated clearly in FIG. 1, which shows the fraction of "leaky" pixels in a 96×64 array vs. thickness of the PANI(ES) polyblend layer. Thus, to avoid shorts, it is necessary to use a relatively thick PANI(ES) layer with thickness of about 200 nm.

With a film thickness of 200 nm or greater, the electrical resistivity of the PANI(ES) layer should be greater than or equal to $10^4$ ohm-cm to avoid crosstalk and inter-pixel current leakage. Values in excess of $10^5$ ohm-cm are preferred. Even at $10^5$ ohm-cm, there is some residual current leakage and consequently some reduction in device efficiency. Thus, values of approximately $10^6$ ohm-cm are even more preferred. Values greater than $10^7$ ohm-cm will lead to a significant voltage drop across the injection/buffer layer and therefore should be avoided. To achieve high resistivity PANI(ES) materials with resistivities in the desired range requires reformulation of the PANI(ES).

Thus, there is a need for a formulation of high resistivity PANI(ES) for use in high efficiency pixellated polymer emissive displays.

SUMMARY OF THE INVENTION

The present invention is directed to a PANI-PAAMPSA film comprising polyaniline in the emeraldine salt form (PANI) with poly(2-acrylamido-2 methyl-1-propanesulfonic acid) (PAAMPSA) as the counterion, and a method of forming the film by casting. In a preferred embodiment, the PANI-PAAMPSA film is a blend of PANI-PAAMPSA with at least one water-soluble host polymer. The invention is also directed to an electronic device comprising the PAM-PAAMPSA film. Further, the invention is directed to a light-emitting diode including the PANI-PAAMPSA film. In a preferred embodiment, the film of the present invention is disposed adjacent to the high work function electrode. In another preferred embodiment, in the light-emitting polymer device, the PANI-PAAMPSA layer is disposed between the light-emitting layer and the high work function electrode.

As used herein, the term "adjacent" is used to indicate that the PANI-PAAMPSA layer is closer to the high work function electrode, when compared to its distance to the low work function electrode, but that there may or may not be another layer present between the PANI-PAAMPSA layer and the high work function electrode. As used herein the term "between" also does not preclude the possibility that a component layer other than the PANI-PAAMPSA layer may be present between the high work function electrode and the light-emitting polymer.

As used herein, the terms "conductivity" and "bulk conductivity" are used interchangeably, the value of which is provided in the unit of Siemens per centimeter (S/cm). In addition, the terms "surface resistivity" and "sheet resistance" are used interchangeably to refer to the resistance value that is a function of sheet thickness for a given material, the value of which is provided in the unit of ohm per square (ohm/sq). Also, the terms "bulk resistivity" and "electrical resistivity" are used interchangeably to refer to the resistivity that is a basic property of a specific material (i.e., does not change with the dimension of the substance), the value of which is provided in the unit of ohm-centimeter (ohm-cm). Electrical resistivity value is the inverse value of conductivity.

DETAILED DESCRIPTION OF PREFERRED EMBODIMENTS

The invention is based on the development of a formulation of emeraldine salt of polyaniline, PANI(ES), more particularly, PANI-PAAMPSA formulations, which leads to high resistivity PANI(ES) films useful in high efficiency electronic devices, such as pixelated polymer emissive displays. In addition, a method has been developed for depositing a thin transparent film of high resistivity PANI(ES) from an aqueous dispersion onto a substrate, such as either a pre-patterned ITO-on-glass substrate or pre-patterned ITO-on-plastic substrate. By using the high resistivity PANI(ES) layer described in this invention, long operating life is enabled in high information content displays without the need for registered patterning of the PANI(ES) layer.

While the formulation of the invention is useful in non-pixelated as well as pixelated electronic devices, the advantages are especially applicable in pixelated devices, such as, for example an electroluminescent display.

Device Configuration

Figure 1:
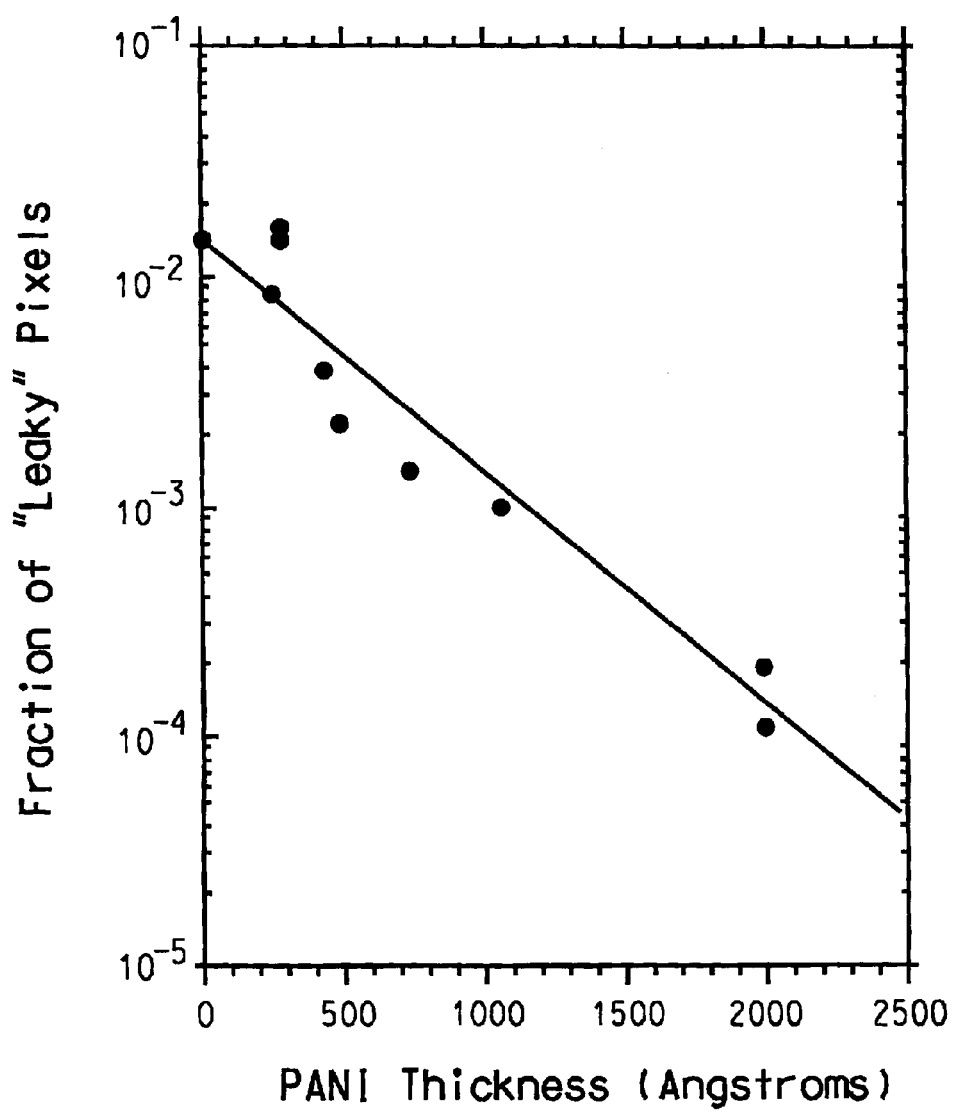
FIG. 1 is a graph which shows the fraction of "leaky" pixels (in a 96×64 array) vs. thickness of the known PANI (ES) layer.
Figure 2:
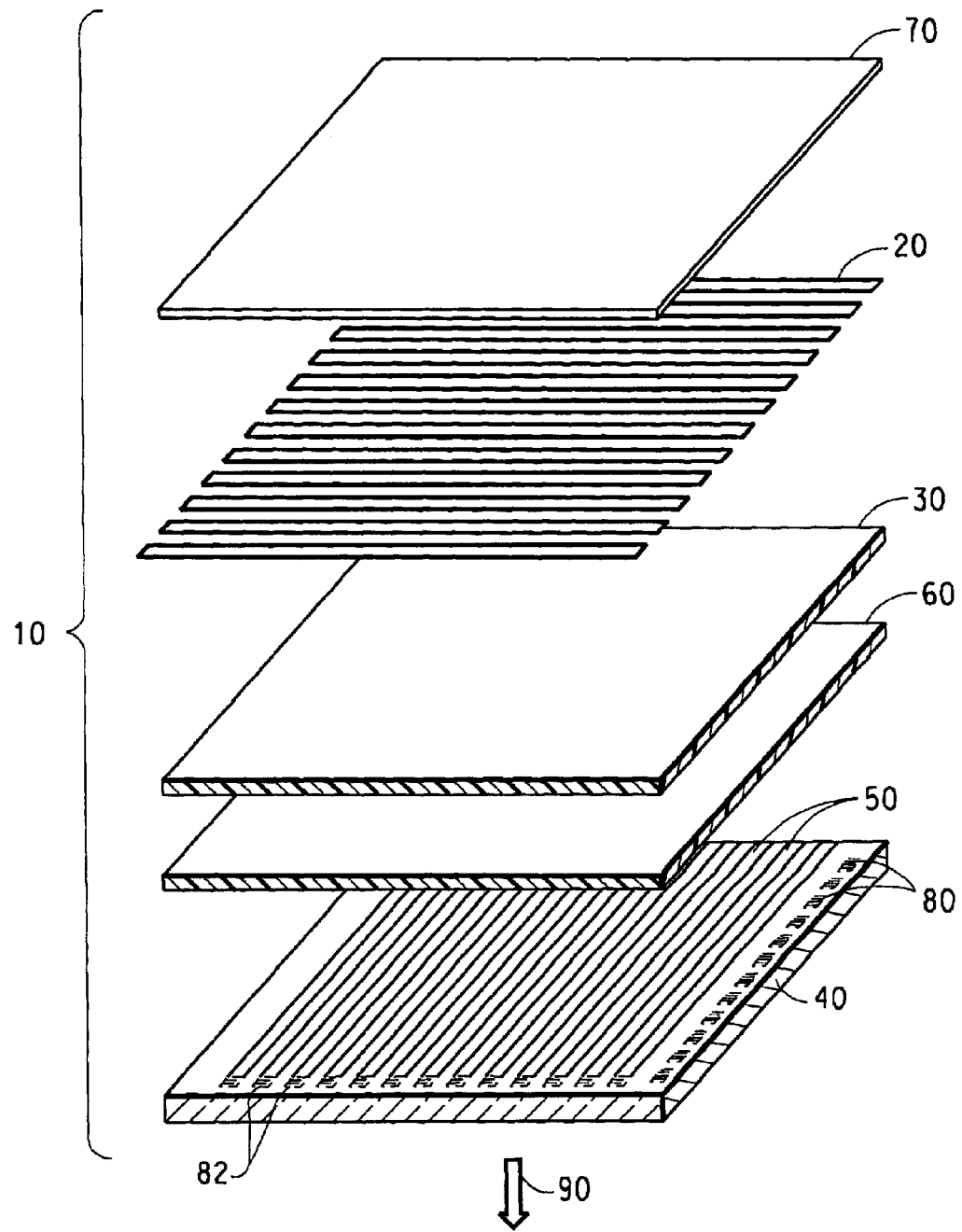
FIG. 2 is a projected schematic diagram of the component layers of a passively addressed, pixelated, polymer LED display.

FIG. 2 shows a polymer emissive device 10 having 156 (12×13) pixels. As shown in FIG. 2, each individual pixel of the device 10 includes an electron injecting (electrode) contact 20 made from a relatively low work function metal as one electrode on an emissive film 30 deposited on a glass or polymeric film substrate 40, which has been partially coated with a layer 50 of transparent conducting material with higher work function (high ionization potential) to serve as the second (transparent) electron-withdrawing (anode) electrode. The component layers 20, 30, 40, 50 are common components in known polymer LEDs (D. Braun and A. J. Heeger, *Appl. Phys. Lett.* 58, 1982 (1991). In accordance with this invention, a layer 60 comprising high resistivity PANI(ES) is interposed between the emissive layer 30 and the high work function electrode 50. Electrode 20 is electrically connected to contact pads 80, and electrode 50 is electrically connected to contact pads 82. The layers 20, 30, 40, 50, and 60 are then isolated from the environment by a hermetic seal layer 70. Upon application of electricity via contact pads 80, 82, which pads are outside of the hermetic seal 70, light is emitted from the device in the direction shown by arrow 90.

The PANI-PAAMPSA Layer (60)

In accordance to the present invention layer 60 includes a PANI-PAAMPSA film containing polyaniline in the emeraldine salt form with poly(2-acrylamido-2 methyl-1-propanesulfonic acid) as a counterion.

The PANI-PAAMPSA complex of the invention can be prepared by any known method for forming PANI(ES) complexes, including, for example the methods described in Y. Cao et al., *Polymer,* 30 (1989) 2305; and Steven P. Armes and Mahmoud Aldissi, *J. Chem. Soc., Chem. Commun.* 1989, 88. In a preferred embodiment, aniline is dissolved in a suitable aniline solvent. The PAAMPSA can then be added into aniline in solvent to get aniline-PAAMPSA salt which is soluble in water. Once aniline is completely dissolved into water, reaction vessel can be placed into thermostart in order to regulate the reaction temperature. Although lower temperature can be used the typical polymerization temperature can be maintained between 0° C. and 25° C. Lower temperature gives polyaniline with high molecular weight, but reaction time would be longer. A strong oxidizer can then be added to the solution to initiate polymerization. After polymerization is completed, the emulsion of PANI-PAAMPSA can be separated from reaction mixture by adding acetone. The resulting PANI-PAAMPSA can be purified at least twice by dispersion into water and then precipitation from mixture by acetone, to remove unreacting aniline monomer and oxidants and byproduct of polymerization were eliminated from PANI-PAAMPSA.

Suitable aniline solvents are water-soluble solvents that do not adversely affect the desired chemical reaction and include, for example, water, mixture of water with at least one water-soluble alcohols, mixture of water with tetrahydrofuran (THF), mixture of water with dimethyl sulfoxide (DMSO), or mixture of water with N,N'-dimethylformamide (DMF) or mixture of water with other solvents mixable with water.

Suitable oxidizer useful to form the PANI-PAAMPSA complex include, for example, ammonium persulfate, potassium dichromate and ferric chloride and hydrogen peroxides.

The resistivity of layer 60 can be affected by, for example, the ratio of aniline to PAAMPSA used to form the PANI-PAAMPSA complex, the thickness of layer 60, as well as the presence of other components in layer 60.

In a preferred embodiment, the weight ratio of aniline to PAAMPSA used to form the PANI-PAAMPSA complex is from 2:1 to 0.5:1. More preferably, the aniline to PAAMPSA weight ratio is about 1:1. We have found that, with decreasing aniline to PAAMPSA ratio, the conductivity and dispersion of the PANI(ES) also decrease.

Depending on the amount and type of additional components in layer 60, typical thicknesses for layer 60 can range from about 100 Å up to about 2500 Å.

In one embodiment the resistivity of layer 60 is further controlled by blending the PANI-PAAMPSA in one or more water dispersible and/or water-soluble host polymers. Suitable host polymers include, but are not limited to, polyacrylamide (PAM), PAAMPSA, poly(acrylic acid) (PAA), poly(styrenesulfonic acid), poly(vinyl pyrrolidone)(PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamine, polyimines, polyvinylpyridines, polysaccharide, and polyurethane dispersion, and combinations thereof.

The desired amount of such host polymer(s) to form a blend or polyblend in layer 60 depends upon the desired resistivity value of the final film and processing considerations, including the molecular weight of the host polymer and the desired viscosity of the blend or polyblend. In one preferred embodiment, the weight ratio of PANI(ES)-PAAMPSA complex to host polymer(s) in layer 60 is from 1:0.1 to 1:9.

Where the PANI-PAAMPSA forms a blend with one or more host polymer(s), the following procedure can be used to prepare the blend or polyblend: the PANI(ES)-PAAMPSA is dissolved in a suitable water-soluble solvent to form a first solution, the host polymer(s) is/are dissolved in a suitable water-soluble solvent to form a second solution, and a blend solution is formed by combining the first and second solutions in the desired ratio.

Suitable water-soluble solvents for the first and second solutions in the blend-making process may be the same or different from the aniline solvents, and may be, for example, and include, for example, water, mixture of water with at least one water-soluble alcohol, mixture of water with tetrahydrofuran (THF), mixture of water with dimethyl sulfoxide (DMSO), or mixture of water with N,N'-dimethylformamide (DMF) or mixture of water with other solvents mixable with water. In a preferred embodiment, the PANI-PAAMPSA layer 60 is useful in a non-pixelated electronic device and has an electrical resistivity of greater than $10^2$ ohm-cm. In another preferred embodiment, layer 60 includes a blend or polyblend of PANI-PAAMPSA with at least one water-soluble or water dispersible host polymer (s) and has an electrical resistivity greater than $10^4$ ohm-cm, more preferably $10^5$ ohm-cm, even more preferably greater than $10^6$ ohm-cm. Such blends and polyblends of PANI-PAAMPSA are useful in a pixellated electronic device.

While layer 60 in the illustrated device 10 is un-patterned, it is understood that the PANI-PAAMPSA film of the present invention may also be patterned.

The High Work Function Electrode (50)

Other organic or inorganic materials having electrical work functions similar to ITO may be used in component 50, including, for example, mixed oxides of metals from Group IIA (Be, Mg, Ca, Sr, Ba, Ra), other metals from Group IIIA (B, Al, Ga, Tl) and metals from Group IVA (C, Si, Ge, Sn, Pb). Examples of suitable organic materials useful in place of ITO include polyaniline and poly(3,4-ethylenedioxythiophene) (PEDT).

In a pixellated electroluminescent device, the surface electrical resistance of layer 50 is preferably less than about 100 ohms/square. As such, the typical thicknesses for layer 50 can range from about 100 Å up to about 2500 Å.

In the illustrated embodiment, the component layers 50 and 60 and, when present, the substrate 40, can be "transparent" or "semitransparent" so as to permit the emitted light to pass out though these components. A "transparent" or "semitransparent" material is a material that passes at least a fraction of the light impinged upon it, such as at least about 10% and preferably at least 20% of the light emitted by the light-emitting layer 30 at the wave length of this emission. In an alternative embodiment (not shown) the low work function electrode 20 is transparent or semitransparent, while the components 40, 50 and/or 60 are opaque.

The Light-Emitting Layer (30)

Layer 30 can include any organic luminescent material, including polymer and/or molecular light emitting materials.

Among the promising materials for use as active layers in polymer LEDs are poly (phenylene vinylene), PPV, and soluble derivatives of PPV such as, for example, poly(2-methyloxy-5-(2'-ethyl-hexyloxy)-1,4-phenylene vinylene), MEH-PPV, a semiconducting polymer with an energy gap Eg of approximately 2.1 eV. This material is described in more detail in U.S. Pat. No. 5,189,136. Other suitable polymers include, for example, the poly(3-alkylthiophenes) as described by D. Braun, G. Gustatsson, D. McBranch and A. J. Heeger, *J. Appl. Phys.* 72, 564 (1992) and related derivatives as described by M. Berggren, O. Inganas, G. GustaLsson, J. Rasmusson, M. R. Andersson, T. Hjertberg and O. Wennerstrom; poly(para-phenylene) as described by G. Grem, G. Leditzlcy, B. Ullrich, and G. Leising, *Adv. Mater* 4, 36 (1992), and its soluble derivatives as described by Z. Yang, I. Sokolik, F. E. Karasz in *Macromolecules*, 26, 1188 (1993), polyquinoline as described by I. D. Parker, Q. Pei and M. Marrocco, *Appl. Phys. Lett.* 65, 1272 (1994). Blends of conjugated semiconducting polymers in non-conjugated host polymers are also useful as the active layers in polymer LEDs as described by C. Zhang, H. von Seggem, K Pakbaz, B. Krsabel, H. W. Schmidt and A. J. Heeger, *Synth. Met.*, 62, 35 (1994). Also useful are blends comprising two or more conjugated polymers as described by H. Nishino, G. Yu, T-A Chen, R. D. Rieke and A. J. Heeger, *Synth. Met.*, 48, 243 (1995). The use of conjugated copolymers in electroluminescent application is described by A. Holmes, D. D. Bradley, R. H. Friend, A. Kraft, P. Burn and A. Brown in U.S. Pat. No. 5,401,827. Generally, materials for use as active layers in polymer LEDs include semiconducting conjugated polymers, more specifically semiconducting conjugated polymers which exhibit photoluminescence, and still more specifically semiconducting conjugated polymers which exhibit photoluminescence and which are soluble and processable from solution into uniform thin films.

In another embodiment, the light-emissive layer 30 may include organic molecules such anthracene, thiadiazole derivatives, and coumarin derivatives are known to show electroluminescence. In addition, complexes of 8-hydroxyquinolate with trivalent metal ions, particularly aluminum, have been extensively used as electroluminescent components, as has been disclosed in, for example, Tang et al., U.S. Pat. No. 5,552,678. In particular, fac-tris (2-phenylpyridine) iridium can be used as the active component in organic light-emitting devices. (Burroughes and Thompson, Appl. Phys. Lett. 1999, 75, 4.) The performance is maximized when the iridium compound is present in a host conductive material. Thompson has further reported devices in which the active layer is poly(N-vinyl carbazole) doped with fac-tris[2-(4',5'-difluorophenyl)pyridine-$C'^2$,N] iridium(III). (Polymer Preprints 2000, 41(1), 770.)

The Low Work function Electrode (20)

Suitable relatively low work function metals for use as cathode materials are the alkaline earth metals such as calcium, barium, strontium and rare earth metals such as ytterbium. Alloys of low work function metals, such as for example alloys of magnesium in silver and alloys of lithium in aluminum, are also known in prior art (U.S. Pat. Nos.

5,047,687; 5,059,862 and 5,408,109). The thickness of the electron injection cathode layer has ranged from 200–5000 Å as demonstrated in the prior art (U.S. Pat. Nos. 5,151,629, 5,247,190, 5,317,169 and J. Kido, H. Shionoya, K. Nagai *Appl. Phys. Lett.*, 67(1995)2281). A lower limit of 200–500 Ångstrom units (Å) is preferred in order to form a continuous film (full coverage) for cathode layer (U.S. Pat. No. 5,512,654; J. C. Scott, J. H. KauLman, P. J. Brock, R DiPietro, J. Salem and J. A. Goitia, *J. Appl. Phys.*, 79(1996) 2745; I. D. Parker, H. H. Kim, *Appl. Phys. Lett.*, 64(1994) 1774).

Electron-injecting cathodes comprising ultra-thin layer alkaline earth metals, calcium, strontium and barium, have been described for polymer light emitting diodes with high brightness and high efficiency. Compared to conventional cathodes fabricated from the same metals (and other low work function metals) as films with thickness greater than 200Å, cathodes comprising ultra-thin layer alkaline earth metals with a thickness less than 100 Å provide significant improvements in stability and operating life to polymer light emitting diodes (Y. Cao and G. Yu, PCT WO 98/57381). Electron-injecting cathodes comprising thin metal-oxide layers have also been described by Y. Cao in PCT WO 00/22683 for use in polymer light emitting diodes.

By using the high resistivity PANI(ES) layer described in this invention, long operating life is enabled in high information content displays without the need for registered patterning of the PANI(ES) layer.

While the illustrated device 10 is described as useful for a light-emitting display, it is understood that the present PANI-PAAMPSA material is also useful in other electronic devices, including, for example, photosensors, photodetectors, microcavity, electrically pumped polymer and organic lasers, as well as organic and polymer FETs (field effect transistors).

Contact Pads (80 82)

Any contact pads 80, 82 useful to connect the electrode of the display 10 to the power source (not shown) can be used, including, for example, conductive metals such as gold (Au), silver (Ag), nickel (Ni), copper (Cu) or aluminum (Al).

Preferably, contact pads 80, 82 have a height (not shown) projected beyond the thickness of the high work function electrode lines 50 below the total thickness of layer.

Preferably, the dimensions of layers—30, 50, and 60 are such that contacts pads 80 are positioned on a section of the substrate 40 not covered by layers 30, 60 and 70. In addition, the dimensions of layer 20, 30, 50, and 60 are such that the entire length and width electrode lines 20 and electrode lines 50 have at least one layer 30, 60 intervening between the electrodes 20, 50, while electrical connection can be made between electrode 20 and contact pads 80.

Fabrication Method

The various elements other than the PANI-PAAMPSA layer of the devices of the present invention may be fabricated by any of the techniques well known in the art, such as solution casting, vapor deposition, screen printing, contact printing, sputtering, evaporation, precursor polymer processing, melt-processing, and the like, or any combination thereof.

The PANI-PAAMPSA film layer of the present invention is provided using any known casting process, such as solution casting and drop casting, screen printing, contact printing and the like, or any combination thereof. An aqueous solution or aqueous dispersion containing PANI-PAAMPSA complex or a blend/polyblend of at least one host polymer and PANI-PAAMPSA complex can be made with any suitable solvent. Suitable PANI-PAAMPSA solvent for the casting process are water-soluble and include, for example, water, mixtures of water and water-soluble alcohols, mixture of water with THF, mixture of water with DMSO, mixture of water with DMF, or mixture of water with other solvents mixable with water. Although not necessary, the same aniline solvent used to form PANI-PAAMPSA complex can be used to cast the PANI-PAAMPSA film.

As is known in the art, the thickness of the film can be affected by, among others the viscosity, solid content, and chemical composition of the aqueous dispersion or aqueous solution. A typical viscosity range is from 50 centipose (cps) to 200 cps. As such, the typical weight ratio of polymer material (i.e., PANI-PAAMPSA, and, when present, the at least one host polymers) to solvent is 0.5% (w/w) to 5% (w/w). Process aids such as viscosity modifiers may also be added to the aqueous dispersion/solution for casting.

Casting can be performed at room temperature, although lower or elevated temperatures known in the art can be used.

A thin film can then be casted from the aqueous solution or aqueous dispersion onto a support such as a thin layer of anode material that is optionally on a substrate of glass, plastic, ceramic, or silicon, or flexible support.

The present invention provides a method for obtaining long operating life by using an anode coated with a formulation comprising PANI-PAAMPSA.

Unless otherwise specified all percentages are percentages by weight.

EXAMPLES

Example 1

PANI-PAAMPSA was prepared using a procedure similar to that described in the reference Y. Cao, et al, *Polymer,* 30(1989) 2305, more specifically, as described below. HCl in this reference was replaced by poly(2-acrylamido-2-methyl-1-propanesulfonic acid (PAAMPSA) (available from Aldrich, Milwaukee, Wis. 53201).

The emeraldine salt (ES) form was verified by the typical green color. First, 30.5 g (0.022 mole) of 15% PAAMPSA in water (Aldrich) was diluted to 2.3% by adding 170 ml water. While stirring, 2.2 g (0.022M) aniline was added into the PAAMPSA solution. Then, 2.01 g (0.0088M) of ammonium persulfate in 10 ml water was added slowly into the aniline/PAAMPSA solution under vigorous stirring. The reaction mixture was stirred for 24 hours at room temperature. To precipitate the product, PANI-PAAMPSA, 1000 ml of acetone was added into reaction mixture. Most of acetone/water was decanted and then the PANI-PAAMPSA precipitate was filtered. The resulting gum-like product was washed several times by acetone and dried at 40° C. under dynamic vacuum for 24 hours.

This Example demonstrates the direct synthesis of PANI-PAAMPSA.

Example 2

One gram (1.0 g) of the PANI-PAAMPSA powder as prepared in Example 1 was mixed with 100 g of deionized water in a plastic bottle. The mixture was rotated at room temperature for 48 hours. The solutions/dispersions were then filtered through 0.45 µm polypropylene filters. Different concentrations of PANI-PAAMPSA in water are routinely prepared by changing the quantity of PANI-PAAMPSA mixed into the water.

This Example demonstrates that PANI-PAAMPSA can be dissolved/dispersed in water and subsequently filtered through a 0.45 µm filter.

Example 3

A PANI-PAAMPSA film was drop-casted from 1% w/w) solution/dispersion in water. The film thickness was measured to be 650 nm by a surface profilometer (Alpha-Step 500) (available from KLA-Tencor, San Jose, Calif. 95134). Using standard X-ray equipment, a wide-angle diffraction diagram (WAXD) was taken on the PANI-PAAMPSA film. The diffraction pattern showed no characteristic diffraction peaks; the data indicated that the film was amorphous.

This Example demonstrates that the PANI-PAAMPSA film cast from water is amorphous (crystallinity less than 10%).

Example 4

Four grams (4.0 g) of polyacrylamide (PAM) (M.W. 5,000,000–6,000,000, available from Polysciences (Warrinton, Pa. 18976) was mixed with 400 ml deionized water in a plastic bottle. The mixture was rotated at room temperature for at least 48 hours. The solution/dispersion was then filtered through 1 μm polypropylene filters. Different concentrations of PAM are routinely prepared by changing the quantity of PAM dissolved.

This Example demonstrates that PAM can be dissolved/dispersed in water and subsequently filtered through a 1 μm filter.

Example 5

Ten grams (10 g) of the PANI-PAAMPSA solution as prepared in Example 2 was mixed with 20 g of 1% (w/w) PAM solution as prepared in Example 4 (mixed at room temperature for 24 hours). The solution was then filtered through 0.45 μm polypropylene filters. The PANI-PAAMPSA to PAM ratio was 1:2 in the blend solution. Different blend ratios of the PANI-PAAMPSA/PAM solutions were prepared by changing the concentrations of PANI-PAAMPSA and PAM in the starting solutions including the following: PANI-PAAMPSA/PAM (w/w) at 2/1, and 1/1.

This Example demonstrates that PANI-PAAMPSA/PAM blends can be prepared with a range of PAM concentrations, that these blends can be dissolved/dispersed in water and that they can be filtered through a 0.45 μm.

Example 6

Example 5 was repeated, but PAAMPSA was used instead of PAM. The blend ratio of PANI-PAAMPSA/PAAMPSA (w/w) was, respectively, 1/0.1, 1/0.3, 1/0.5, 1/1 and 1/2.

This Example demonstrates that PANI-PAAMPSA/PAAMPSA blends can be prepared with a range of PAAMPSA concentrations, that these blends can be dissolved/dispersed in water and that they can be filtered through a 0.45 μm filter.

Example 7

Example 5 was repeated, but PEO was used instead of PAM. The blend ratio of PANI-PAAMPSA/PEO (w/w) was 1/1.

Example 8

Glass substrates were prepared with patterned ITO electrodes. Using the blend solutions as prepared in Examples 5, 6 and 7, polyaniline blend layers were spin-cast on top of the patterned substrates and thereafter, baked at 90° C. in a vacuum oven for 0.5 hour. The resistance between ITO electrodes was measured using a high resistance Keithley 487 Picoammeter, from Keithley Instruments Inc., (Cleveland, Oh. 44139). Table 1 shows the conductivity of PANI(ES)-blend films with different blend compositions. As can be seen from Table, the conductivity can be controlled over a wide range.

This Example demonstrates that the PANI-PAAMPSA blends can be prepared with bulk conductivities less than $10^{-4}$ S/cm, and even less than $10^{-5}$ S/cm; i.e. sufficiently low that interpixel current leakage can be limited without need for patterning the PANI-PAAMPSA blend film.

TABLE 1

Surface resistivity and bulk conductivity of PANI-PAAMPSA blends

| Blend | host polymer (B) (if present) | Thickness (Å) | A/B ratio* (w/w) | Surface Resistance (ohm/sq) | Conductivity (S/cm) | Electrical Resistivity (ohm-cm)** |
|---|---|---|---|---|---|---|
| 100 | none | 350 | | $1.2 \times 10^8$ | $2.3 \times 10^{-3}$ | $4.3 \times 10^2$ |
| 101 | none | 200 | | $2.2 \times 10^8$ | $2.2 \times 10^{-3}$ | $4.5 \times 10^2$ |
| 102 | PAM | 300 | 2/1 | $2.3 \times 10^9$ | $1.5 \times 10^{-4}$ | $6.7 \times 10^3$ |
| 103 | PAM | 230 | 2/1 | $5.3 \times 10^9$ | $8.2 \times 10^{-5}$ | $1.2 \times 10^4$ |
| 104 | PAM | 510 | 1/1 | $8.2 \times 10^9$ | $2.3 \times 10^{-5}$ | $4.3 \times 10^4$ |
| 105 | PAM | 264 | 1/1 | $2.0 \times 10^{10}$ | $1.9 \times 10^{-5}$ | $5.3 \times 10^4$ |
| 106 | PAM | 220 | 1/1 | $2.2 \times 10^{10}$ | $2.1 \times 10^{-5}$ | $4.8 \times 10^4$ |
| 107 | PAM | 285 | 1/2 | $1.4 \times 10^{11}$ | $2.5 \times 10^{-6}$ | $4 \times 10^5$ |
| 108 | PAAMPSA | 260 | 1/0.1 | $2.4 \times 10^9$ | $1.6 \times 10^{-4}$ | $6.3 \times 10^3$ |
| 109 | PAAMPSA | 350 | 1/0.3 | $9.2 \times 10^9$ | $4.6 \times 10^{-4}$ | $2.2 \times 10^3$ |
| 110 | PAAMPSA | 230 | 1/0.5 | $4.5 \times 10^8$ | $9.5 \times 10^{-4}$ | $1.1 \times 10^3$ |
| 111 | PAAMPSA | 630 | 1/0.5 | $3.7 \times 10^8$ | $4.3 \times 10^{-4}$ | $2.3 \times 10^3$ |
| 112 | PAAMPSA | 920 | 1/0.5 | $6.8 \times 10^7$ | $1.6 \times 10^{-4}$ | $6.3 \times 10^3$ |
| 113 | PAAMPSA | 950 | 1/1 | $2.8 \times 10^8$ | $3.8 \times 10^{-4}$ | $2.6 \times 10^3$ |
| 114 | PAAMPSA | 1280 | 1/1 | $6.7 \times 10^7$ | $1.2 \times 10^{-3}$ | $8.3 \times 10^2$ |
| 115 | PAAMPSA | 1740 | 1/2 | $2.5 \times 10^8$ | $2.3 \times 10^{-4}$ | $4.3 \times 10^3$ |
| 116 | PAAMPSA | 3060 | 1/2 | $8.4 \times 10^7$ | $3.9 \times 10^{-4}$ | $2.6 \times 10^3$ |
| 117 | PEO | 250 | 1/1 | $3.0 \times 10^9$ | $1.3 \times 10^{-4}$ | $7.7 \times 10^3$ |

*A being PANI-PAAMPSA
**Electrical Resistance (i.e., inverse of conductivity)

Example 9

20 g of a PANI-PAAMPSA solution as prepared in Example 2 was mixed (at room temperature for 12 days) with 10 g of 1 wt % PAM solution as prepared in Example 4 and 2.0 g of 15% PAAMPSA solution (available from Aldrich) The solution was then filtered through 0.45 μm polypropylene filters. The content of PANI-PAAMPSA in the blend solution was 33wt % Different blend ratios of the PANI-PAAMPSA:PAAMPSA:PAM blend solutions are prepared by changing the concentrations in the starting solutions.

Example 10

Example 9 was repeated; the content of PANI-PAAMPSA is kept at 33 wt %, but the ratio of host polymers PAAMPSA/PAM (w/w) was changed to 2/0, 0.5/1, 1/1 and 0/2, respectively.

Example 11

30 g of a solution as prepared in Example 2 was mixed with 15 g of deionized water and 0.6 g of PAM (M.W. 5,000,000–6,000,000, available from Polysciences) under stirring at room temperature for 4–5 days. The ratio of PANI-PAAMPSA to PAM in the blend solution was 1/2. Blend solutions were also prepared in which the content of PANI-PAAMPSA was 0, 10, 25 and 40%, respectively.

Example 12

Figure 3:
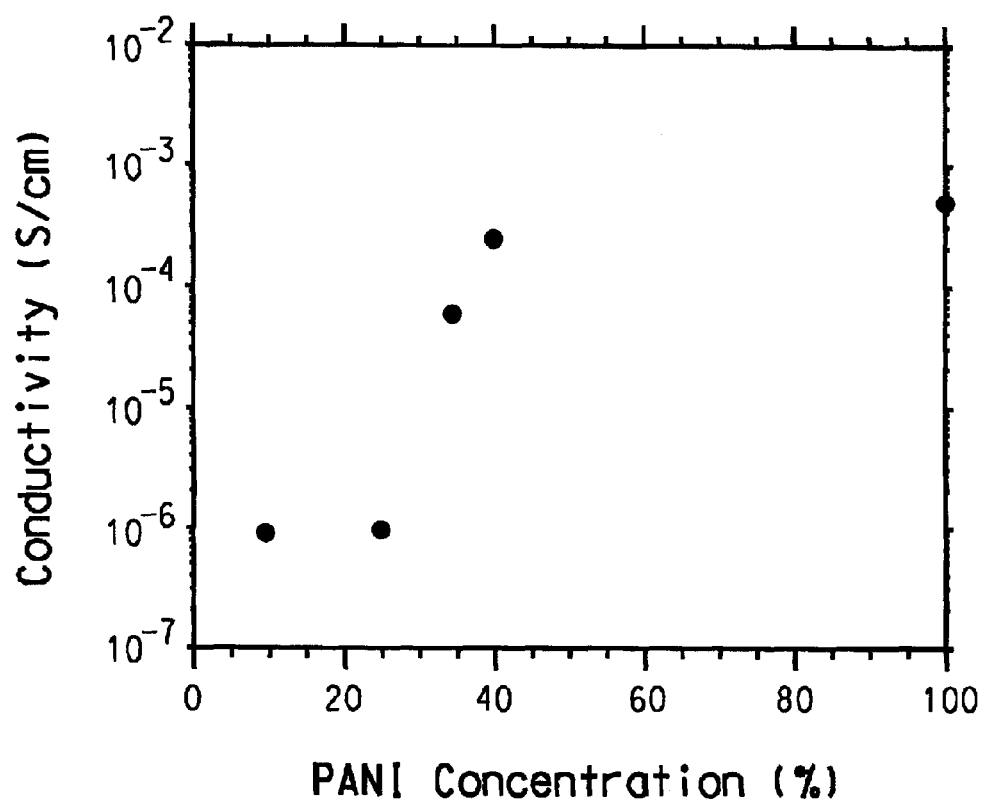
FIG. 3 is a graph which shows the dependence of the conductivity of PANI-PAAMPSA polyblends on PANI-PAAMPSA content.

The resistance measurements of Example 8 were repeated, but the PANI(ES) layer was spin-cast from the blend solutions prepared in Examples 11. FIG. 3 shows the conductivity of PANI(ES)-blend films with different blend compositions. As can be seen from the data, the conductivity can be controlled in wide range to meet display requirements. Conductivity values less than $10^{-5}$ S/cm (electrical resistivity of greater than $10^{-5}$ ohm-cm). can be obtained. With higher concentrations of PAM in the blend, the conductivity dropped below $10^{-6}$ S/cm (electrical resistivity of greater than $10^{-6}$ ohm-cm).

This Example demonstrates that PANI(ES)-blend films can be prepared with conducitivities less than $10^{-5}$ S/cm and even less than $10^{-6}$ S/cm.

Example 13

The resistance measurements of Example 8 were repeated, but the PANI(ES) layer was spin-cast from the blend solutions as prepared in Examples 9 and 10. Table 2 shows the conductivity of polyblend films with different blend compositions; the conductivity can be controlled over a wide range of values.

This Example demonstrates that the PANI-PAAMPSA blends using PAAMPSA/PAM as host polymers can be prepared with bulk conductivities less than $10^{-5}$ S/cm, even less than $10^{-6}$ S/cm and for specific formulations less than $10^{-7}$ S/cm. The conductivities of the PANI(ES) blends are sufficiently low that interpixel current leakage can be limited without need for patterning the blend film.

TABLE 2

Bulk ans surface resistance for PANI(ES) blends with different compositions and thickness

| Ratio of host polymers* PAAMPS/ PAM | Thickness (Å) | R (ohm)** | ohm/sq | Conductivity (S/cm) | Resistivity (ohm-cm) |
|---|---|---|---|---|---|
| 1.5/0.5 | 2100 | $9.8 \times 10^6$ | $5.2 \times 10^8$ | $9.0 \times 10^{-5}$ | $1.1 \times 10^4$ |
|  | 1000 | $1.0 \times 10^8$ | $5.3 \times 10^9$ | $1.9 \times 10^{-5}$ | $5.3 \times 10^4$ |
| 2/0 | 2080 | $1.6 \times 10^7$ | $8.5 \times 10^8$ | $5.6 \times 10^{-5}$ | $1.8 \times 10^4$ |
|  | 1300 | $3.9 \times 10^7$ | $2.1 \times 10^9$ | $3.7 \times 10^{-5}$ | $2.7 \times 10^4$ |
| 0.5/1 | 1850 | $1.2 \times 10^9$ | $6.4 \times 10^{10}$ | $9.3 \times 10^{-7}$ | $1.1 \times 10^6$ |
|  | 1000 | $6.8 \times 10^9$ | $3.6 \times 10^{11}$ | $2.8 \times 10^{-7}$ | $3.6 \times 10^6$ |
| 1/1 | 1620 | $1.1 \times 10^9$ | $5.9 \times 10^{10}$ | $1.0 \times 10^{-6}$ | $1.6 \times 10^6$ |
|  | 1100 | $2.6 \times 10^{10}$ | $1.4 \times 10^{12}$ | $6.5 \times 10^{-8}$ | $1.5 \times 10^7$ |
| 0/2 | 1200 | $2 \times 10^{10}$ | $1.0 \times 10^{12}$ | $8.3 \times 10^{-8}$ | $1.2 \times 10^7$ |
|  | 750 | $3.4 \times 10^{11}$ | $1.8 \times 10^{13}$ | $7.4 \times 10^{-9}$ | $1.4 \times 10^8$ |

*Ratio of polyaniline to total host polymer is 1/2 (w/w)
**Resistance between two adjacent ITO lines in 10 × 10 configuration

Example 14

Figure 4:
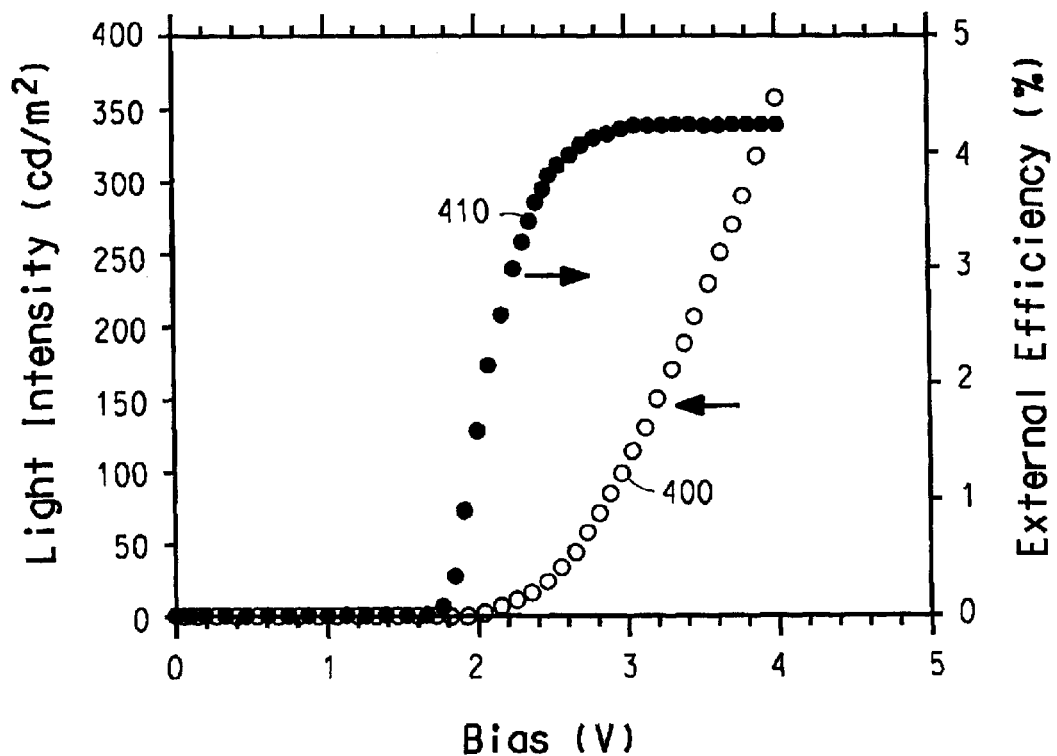
FIG. 4 is a graph which shows the light output and external quantum efficiency for a device fabricated with the PANI-PAAMPSA layer.

Light emitting diodes were fabricated using poly(2-(3, 7dimethyloctyloxy)-5-methoxy-1,4-phenylenevinylene) (DMO-PPV) as the active semiconducting, luminescent polymer; the thickness of the DMO-PPV films were 500–1000 Å. Indium/tin oxide was used as the first layer of the bilayer anode. PANI-PAAMPSA (of Example 2) was spin-coated from 1% solution/dispersion in water onto ITO with thicknesses ranging from 100 to 800 Å, and thereafter, baked at 90° C. in vacuum oven for 0.5 hour. The device architecture was ITO/PANI(ES)-PAAMPSA/DMO-PPV/metal. Devices were fabricated using both ITO on glass as the substrate (Applied ITO/glass) and using ITO on plastic, polyethylene terephthalate, PET, as the substrate (Courtauld's ITO/PEI); in both cases, ITO/PANI-PAAMPSA bilayer was the anode and the hole-injecting contact. Devices were made with a layer of Ba as the cathode. The metal cathode film was fabricated on top of the DMO-PPV layer using vacuum vapor deposition at pressures below $1 \times 10^{-6}$ Torr yielding an acting layer with area of 3 cm$^2$. The deposition was monitored with a STM-100 thickness/rate meter, available from Sycon Instruments, Inc., (East Syracuse, N.Y. 13057) 2,000 Å to 5,000 Å of aluminum was deposited on top of the calcium layer. For each of the devices, the current vs. voltage curve, the light vs. voltage curve, and the quantum efficiency were measured. FIG. 4 shows the light output (curve 400) and external quantum efficiency (curve 410) of ITO/PANI(ES)-PAAMPSA/DMO-PPV/Ba device. The external efficiency of the device with bilayer PANI(ES)-PAAPMSA/ITO anode is significantly higher than device with ITO anode.

This Example demonstrates that high performance polymer LEDs can be fabricated using PANI-PAAMPSA as the second layer of the bilayer anode.

Example 15

The resistance measurements of Example 8 were repeated using commercially available poly (ethylenedioxythiophene), PEDT, polyblend solutions available from Bayer AG (Pittsburgh, Pa. 15205). Table 3 shows that the PANI(ES) blends prepared by this invention (see EXAMPLE 9) yield a layer with much lower conductivity than that obtained from PEDT. This Example demonstrates that the conductivity of PEDT is too high to be used in passively addressed pixelated displays; the inter-pixel leakage current will lead to cross-talk and to reduced efficiency.

TABLE 3

Thickness and conductivity of new PEDT-PSS in comparison with PANI(ES) blend

| Type | Spin speed (RPM) | Thickness (Å) | R* (Mohm) | Rs (Mohm/sq) | Conductivity (S/cm) | Resistivity (ohm-cm) |
|---|---|---|---|---|---|---|
| PEDT-PSS | 600 | 2800 | 0.22 | 11.7 | $3.0 \times 10^{-3}$ | $3.3 \times 10^2$ |
|  | 800 | 2500 | 0.31 | 16.5 | $2.4 \times 10^{-3}$ | $4.2 \times 10^2$ |
|  | 1000 | 2000 | 0.33 | 17.0 | $2.9 \times 10^{-3}$ | $3.4 \times 10^2$ |
|  | 1400 | 1700 | 0.38 | 19.4 | $3.0 \times 10^{-3}$ | $3.3 \times 10^2$ |
|  | 2000 | 1330 | 0.57 | 30.4 | $2.5 \times 10^{-3}$ | $4.0 \times 10^2$ |
|  | 4000 | 1000 | 0.77 | 41.0 | $2.4 \times 10^{-3}$ | $4.2 \times 10^2$ |
| PEDT-TSS | 600 | 1000 | 0.16 | 8.5 | $1.2 \times 10^{-2}$ | $8.3 \times 10^1$ |
|  | 1000 | 760 | 0.19 | 10.1 | $1.3 \times 10^{-2}$ | $7.7 \times 10^1$ |
| PANI(ES) blend | 1000 | 2100 | 9.8 | 522 | $9.0 \times 10^{-5}$ | $1.1 \times 10^4$ |
|  | 2000 | 1500 | 29.0 | 1550 | $4.3 \times 10^{-5}$ | $2.3 \times 10^4$ |
|  | 3000 | 1200 | 84.0 | 4480 | $1.9 \times 10^{-5}$ | $5.3 \times 10^4$ |
|  | 4000 | 1000 | 100.0 | 5300 | $1.9 \times 10^{-5}$ | $5.3 \times 10^4$ |

R*: resistance between two adjacent ITO lines in 10 × 10 configuration (in mega ohms);
Rs: surface resistance (in mega ohm/sq)

Example 16

Example 5 was repeated, but the host polymer was, respectively, poly(acrylic acid), PAM-carboxy, polyvinylpyrrolidone and polystyrene (aqueous emulsion) instead of PAM. PANI-PAAMPSA/host polymersolution/dispersion was prepared as indicated in Example 5.

Example 17

The device measurements summarized in Example 14 were repeated, but the PANI(ES)-blend layer was spin-cast from the blend solutions as prepared in Examples 5 and 16. Table 4 shows the device performance of LEDs fabricated from polyblend films with different host polymers.

This Example demonstrates that the use of PANI-PAAMPSA blends can be used to fabricate polymer LEDs with significantly higher efficiency; this higher efficiency is obtained because inter-pixel current leakage has been significantly reduced by using the high resistance PANI(ES)-blend as the hole injection layer.

TABLE 4

Performance of devices fabricated with different PANI(ES) blends#

| Host polymer | Performance at 8.3 mA/cm$^2$* | | | |
|---|---|---|---|---|
| | V | QE(%) | cd/A | Lm/W |
| PAM(300Å) | 4.9 | 3.5 | 6.3 | 4.1 |
| PAM(2000Å)** | 4.3 | 3.1 | 4.5 | 3.3 |
| poly(acrylic acid)(300Å) | 4.4 | 3.7 | 7.0 | 5.0 |
| PAM-carboxy | — | — | — | 0.04 |
| polyvinylpyrrolidone | 6.3 | 1.0 | 1.3 | 0.6 |
| polystyrene(aq. emulsion) | 6.1 | 0.6 | 0.8 | 0.4 |

*Best device from 5–10 devices
**Concentrated (i.e., after making the blend solution, some solvent was removed to make the solution more viscous, and thereby provide a thicker film).

Example 18

The device measurements summarized in Example 14 were repeated, but the PANI(ES) layer was spin-cast from the blend solutions with different PANI(ES)PAAMPSA/PAM ratios (see EXAMPLE 11). Table 5 shows the device performance of LEDs fabricated from polyblend films with different PANI-PAAMPSA/PAM ratios.

The higher efficiency correlates well with higher resistance in the PANI(ES)(ES)-blend layer. The higher efficiency is obtained with the higher resistance in the PANI(ES)(ES)-blend layer because there is no wasted current due to inter-pixel current leakage.

TABLE 5

Performance of devices fabricated different PANI(ES) blends#

| PANI(ES)PAAMPSA/PAM | Performance at 8.3 mA/cm$^2$ | | | |
|---|---|---|---|---|
| (w/w) | V | QE(%) | cd/A | Lm/W |
| 1/9 | 9.1 | 5.0 | 10.7 | 3.7 |
| 1/3 | 5.6 | 5.0 | 12.6 | 7.1 |
| 1/2 | 5.2 | 4.9 | 13.0 | 7.8 |
| 1/1.5 | 5.2 | 4.8 | 12.1 | 7.3 |
| 1/0 | 4.6 | 4.4 | 11.6 | 8.0 |

Example 19

The device measurements summarized in Example 14 were repeated, but poly[5-(4-(3,7-dimethyloctyloxy) phenyl)-phenylene-1,4-vinylene] (DMOP-PPV) and its random co-polymer with DMO-PPV were used instead of DMO-PPV. The device performance data are listed in Table 6.

This EXAMPLE demonstrates that different color (e.g. red, green, orange etc) can be fabricated using PANI-PAAMPSA as the hole injection layer.

TABLE 6

Device performance of different luminescent polymer on PANT(ES)-PAAMPSA electrode

| Polymer Composition (DMOP-PPV)$_n$-DMO-PPV$_m$ | | EL peak position | Device performance* | | |
|---|---|---|---|---|---|
| n | m | (nm) | V (V) | luminance (cd/m2) | efficiency (%) | color |
| 100 | 0 | 510 | 5.3 | 47 | 1.2 | green |
| 98 | 2 | 530 | 4.8 | 130 | 3.2 | yellowish-green |
| 50 | 50 | 580 | 6.6 | 198 | 4.9 | orange |
| 0 | 100 | 610 | 3.3 | 160 | 3.9 | red |

*at current density of 8.3 mA/cm$^2$

Example 20

Figure 5:
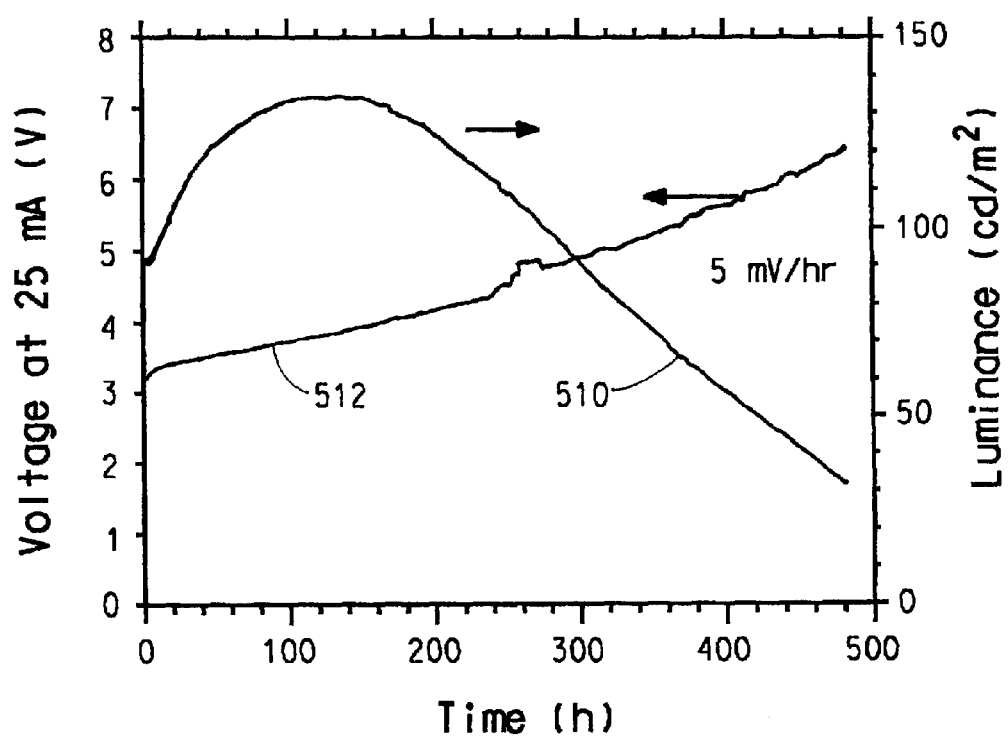
FIG. 5 is a graph which shows the stress induced degradation of a device with PANI-PAAMPSA layer at 85° C.

The device of Example 14 was encapsulated using a cover glass sandwiched by UV curable epoxy. The encapsulated devices were run at a constant current of 8.3 mA/cm$^2$ in ambient atmosphere in an oven at temperatures 25, 50, 70 and 85° C. The total current through the devices was 25 mA with luminance of approximately approximately 100 cd/cm$^2$. FIG. 5 shows the light output (curve 510) and voltage increase (curve 512) during operation at 85° C. In contrast to devices with ITO as anode, which degrade within 10–20 hours of stress at 85° C., the half life of the devices with the ITO/PAAMPSA bilayer exceeds 450 hours with a very low vohage increase (5 mV/hour). From Ahrennius plots of the luminance decay and voltage increase data collected at 50, 70 and 85° C., the temperature acceleration factor was estimated to be ca. 100. Thus, the extrapolated stress life at room temperature was determined to be approximately 40,000 hours.

Figure 6:
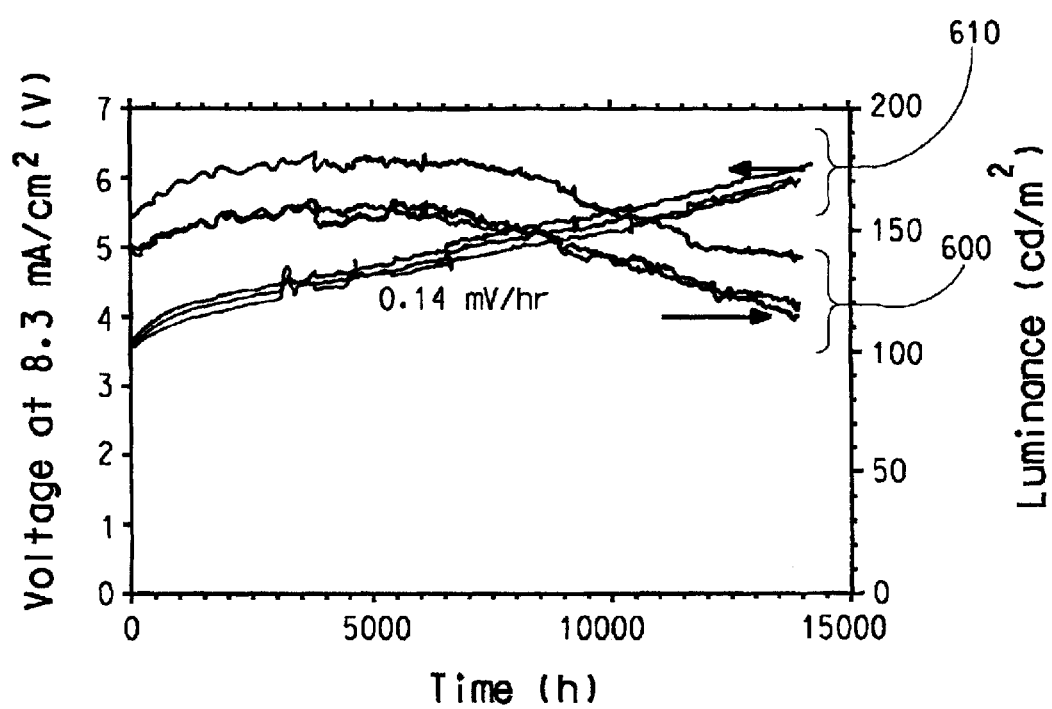
FIG. 6 is a graph which shows the stress induced degradation of devices with PANI-PAAMPSA layer at room temperature.

FIG. 6 shows the real time stress data at room temperature light output (curve 600) and voltage increase (curve 610) at the operation at 25° C. As can be seen in FIG. 6, after 10,000 hours stress, the light output has decreased by only approximately 10%. The voltage increase is less than 0.15 mV/hour.

This Example demonstrates that long lifetime can be obtained for polymer LEDS fabricated with high resistance PANI(ES) layers.

Example 21

Figure 7:
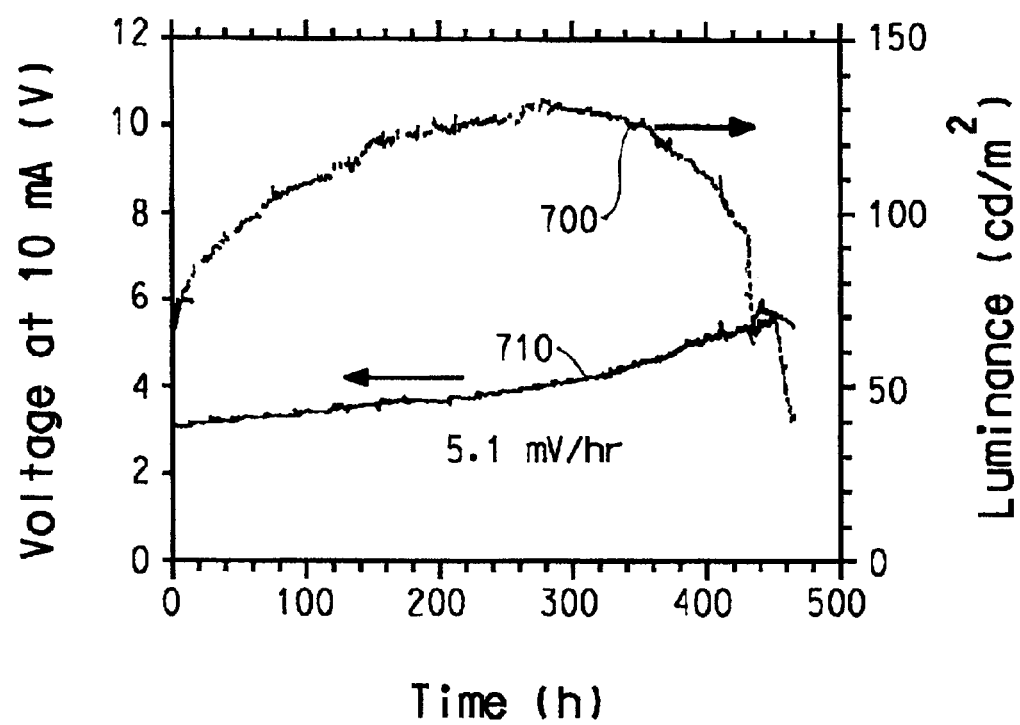
FIG. 7 is a graph which shows the stress induced degradation of a device with a PANI-PAAMPSA blend (Example 9) as the layer; the data were obtained with the device at 70° C.

Examples 14 and 20 were repeated, but the higher resistance PANI(ES) PAAMPSA blend (Example 9) was used for the hole injection/layer. FIG. 7 shows the luminance (curve 700) and voltage (at constant current) (curve 710) vs time during stress at 16.5 mA/cm2 with the device at 70° C.

This Example demonstrates that long lifetime, high performance displays can be fabricated using the PANI-PAAMPSA/PAM blend as hole injection layer.

Example 22

Example 1 was repeated, but 1.7 g of PAM (Polysciences, M.W. 4–6M) was added into aniline-PAAMPSA-water mixture. After vigorous stirring and complete dissolution of PAM in the reaction mixture the oxidant was added into reaction mixture. All other steps were the same as Example 1. A PANI(ES)-blend with polyaniline to PAM ratio of 1:2 was prepared directly from polymerization. Aqueous solutions/dispersions (for example, 1 or 2% w/w) of the final product were prepared by stirring of the resulting powder in deionized water at room temperature for 24 hours in a plastic container. The solution was filtered through a 0.45 $\mu$m filter. The bulk conductivity of a thin film spin-cast from the resulting aqueous dispersion was measured to be (approximately $10^{-6}$ S/cm); i.e. three orders of magnitude lower than the film from Example 1 of same thickness; and one order of magnitude lower than that of blend prepared by mixing of aqueous dispersion from Example 1 and PAM solution in water (see Example 5).

This Example demonstrates that the desired high resistance PANI(ES)-PAAMPSA/PAM blend can be synthesized directly in a single process.

Example 23

Three passively addressed displays were fabricated, each with 96 rows and 64 columns. The gap between ITO columns was 50 $\mu$m. A single pixel was addressed in each display. Photographs of the resulting emission are displayed in FIG. 8. The three displays were identical in every respect except for the resisitivity of the material used for the hole injection layer. The display in FIG. 8a had a low resistance PEDT layer (resistivity approximately equal to 200 ohm-cm) such that the resistance between columns was approximately 20,000 ohms. The display in FIG. 8b had a PANI(ES) polyblend layer (resistivity approximately equal to 4,000 ohm-cm) such that the resistance between columns was approximately 400,000 ohms. The display in FIG. 8c had a higher resistance PANI(ES) polyblend layer (resistivity approximately equal to 50,000 ohm-cm) such that the resistance between columns was approximately 5,000,000 ohms.

Figure 8A:
FIG. 8 shows photographs of three passively addressed displays (96×64) that were identical in every respect except that the display in FIG. 8a had a low resistance PEDT layer (resistivity is ~200 ohm-cm), while the display in FIG. 8b had a PANI-PAAMPSA polyblend layer, (resistivity is ~4,000 ohm-cm), and the display in FIG. 8c a higher resistance PANI-PAAMPSA polyblend layer (resistivity is ~50,000 ohm-cm).
Figure 8B:
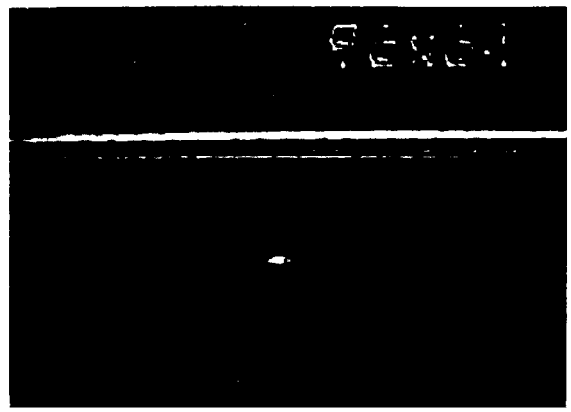
Figure 8C:
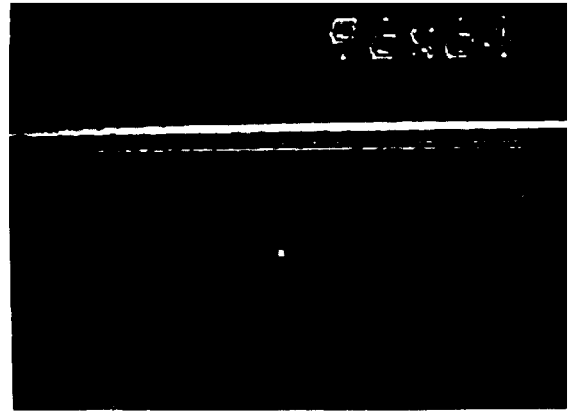

As demonstrated in FIG. 8a, with 20,000 ohms between columns, there is significant cross-talk. This cross-talk had two implications:

(i) The resolution and clarity of the display (FIG. 8a) was limited by the cross-talk. Note that the display in FIG. 8b is improved compared to FIG. 8a and the display in FIG. 8c does not exhibit the cross-talk problem.

(ii) The efficiency of the display (FIGS. 8a and 8b) was reduced by the inter-pixel leakage current.

The lower efficiency means that the display required more power than that required in the identical display (FIG. 8c) where the cross-talk was negligible. Because of inter-pixel current leakage, the display shown in FIG. 8a had an efficiency of approximately half that of the display shown in FIG. 8c. The reduction in efficiency due to inter-pixel leakage current can be a factor as large 3–5 times depending on the detailed inter-pixel spacing and pixel size. Using these data, it was estimated that displays fabricated with a PANI(ES) polyblend layer with resistivity in range from $10^4$ ohm-cm to $10^5$ ohm-cm will not be subject to reduced efficiency from inter-pixel leakage current.

This Example demonstrates the importance of using high resistance PANI(ES) polyblend for the hole injection layer in passively addressed polymer LED displays.

What is claimed is:

1. A PANI-PAAMPSA film comprising a PANI-PAAMPSA complex of polyaniline in the emeraldine salt form (PANI) with poly(2-acrylamido-2 methyl-1-propanesulfonic acid) (PAAMPSA) as a counterion, wherein the complex is formed by the polymerization of aniline in the presence of PAAMPSA, and at least one water dispersible and/or water-soluble host polymer blended with the PANI-PAAMPSA complex.

2. The film of claim 1, having an electrical resistivity greater than $10^2$ ohm-cm.

3. The film of claim 1, wherein the at least one water dispersible and/or water-soluble host polymer is polyacrylamide (PAM), PAAMPSA, poly(acrylic acid) (PAA), poly (styrenesulfonic acid), poly(vinyl pyrrolidone) (PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamine, polyimines, polyvinylpyridines, polysaccharide, polyurethane dispersion, or combinations thereof.

4. A method of forming the film of claim 1, comprising the steps of:

providing a substrate;

providing an aqueous dispersion/solution comprising the at least one water dispersible and/or water-soluble host polymer blended with the PANI-PAAMPSA complex; and depositing the aqueous dispersion/solution onto the substrate to form the film.

5. The method of claim 4, wherein at least one water dispersible and/or water-soluble host polymer is polyacrylamide (PAM), PAAMPSA, poly(acrylic acid) (PAA), poly (styrenesulfonic acid), poly(vinyl pyrrolidone) (PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamine, polyimines, polyvinylpyridines, polysaccharide, polyurethane dispersion, or combinations thereof.

6. An electronic device comprising first and second electrodes, and a PANI-PAAMPSA film between said first and second electrodes, said PANI-PAAMPSA film comprising a PANI-PAAMPSA complex of polyaniline in the emeraldine salt form (PANI) with poly(2-acrylamido-2 methyl-1-propanesulfonic acid) (PAAMPSA) as a counterion, wherein the complex is formed by the polymerization of aniline in the presence of PAAMPSA, and at least one water dispersible and/or water soluble host polymer blended with the PANI-PAAMPSA complex.

7. The electronic device of claim 6, wherein the film has an electrical resistivity greater than $10^2$ ohm-cm.

8. The electronic device of claim 6, wherein at least one water dispersible and/or water-soluble host polymer is polyacrylamide (PAM), PAAMPSA, poly(acrylic acid) (PAA), poly(styrenesulfonic acid), poly(vinyl pyrrolidone) (PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamine, polyimines, polyvinylpyridines, polysaccharide, polyurethane dispersion, or combinations thereof.

9. The electronic device of claim 6, wherein the film has an electrical resistivity greater than $10^4$ ohm-cm.

10. A light-emitting diode comprising first and second electrodes, and a PANI-PAAMPSA film, said PANI-PAAMPSA film comprising a PANI-PAAMPSA complex of polyaniline in the emeraldine salt form (PANI) with poly(2-acrylamido-2 methyl-1-propanesulfonic acid) (PAAMPSA) as a counterion, wherein the complex is formed by the polymerization of aniline in the presence of PAAMPSA, and at least one water dispersible and/or water soluble host polymer blended with the PANI-PAAMPSA complex.

11. The light-emitting diode of claim 10, wherein the film has an electrical resistivity greater than $10^2$ ohm-cm.

12. The diode of claim 10, wherein at least one water dispersible and/or water-soluble host polymer is polyacrylamide (PAM), PAAMPSA, poly(acrylic acid) (PAA), poly(styrenesulfonic acid), poly(vinyl pyrrolidone) (PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamine, polyimines, polyvinylpyridines, polysaccharide, polyurethane dispersion, or combinations thereof.

13. The diode of claim 10, wherein the film has an electrical resistivity greater than $10^4$ ohm-cm.

14. The diode of claim 10, wherein the film has an electrical resistivity of greater than $10^5$ ohm-cm.

15. The diode of claim 10, wherein the film is disposed between a light-emitting polymer and a high work function electrode.

16. The diode of claim 15, wherein:

the high work function electrode comprises polyaniline; poly(3,4-ethylenedioxythiophene); indium tin oxide; an oxide of a metal from Group IIA (Be, Mg, Ca, Sr, Ba, Ra); an oxide of metals from Group IIIA selected from B, Al, Ga, and Ti; or an oxide of metals from Group IVA (C, Si, Ge, Sn, Pb); and wherein the device further comprises a low work function electrode selected from alkaline earth metals, alloys of alkaline earth metals, and alkaline earth metal oxides.

* * * * *